(12) United States Patent
Liberkowski

(10) Patent No.: US 11,974,394 B2
(45) Date of Patent: Apr. 30, 2024

(54) CUSTOMIZABLE CIRCUIT AND METHOD AND MATRIX FOR CREATING A CUSTOMIZED CIRCUIT

(71) Applicant: Janusz B. Liberkowski, Los Gatos, CA (US)

(72) Inventor: Janusz B. Liberkowski, Los Gatos, CA (US)

(*) Notice: Subject to any disclaimer, the term of this patent is extended or adjusted under 35 U.S.C. 154(b) by 328 days.

(21) Appl. No.: 17/175,358

(22) Filed: Feb. 12, 2021

(65) Prior Publication Data
US 2022/0418099 A1    Dec. 29, 2022

Related U.S. Application Data

(60) Provisional application No. 62/995,889, filed on Feb. 19, 2020.

(51) Int. Cl.
*H05K 1/02* (2006.01)
*H01L 23/528* (2006.01)
*G02B 6/13* (2006.01)
*H01L 23/525* (2006.01)

(52) U.S. Cl.
CPC ....... *H05K 1/0289* (2013.01); *H01L 23/5283* (2013.01); *G02B 6/13* (2013.01); *H01L 23/5258* (2013.01); *H05K 1/0293* (2013.01)

(58) Field of Classification Search
CPC .... H05K 1/0289; H05K 1/0287; H05K 1/029; H05K 1/0293
See application file for complete search history.

(56) References Cited

U.S. PATENT DOCUMENTS

2014/0085018 A1* 3/2014 Wang ............ H04B 3/02
                                                                  333/1

* cited by examiner

*Primary Examiner* — Jeremy C Norris
(74) *Attorney, Agent, or Firm* — Jurgen Vollrath

(57) ABSTRACT

In a customizable circuit an interconnect matrix is provided that includes only two conductive layers, the matrix defining a first layer of L-shaped conductive lines and a second layer of substantially L-shaped conductive line segments that are connected to electrical components.

19 Claims, 8 Drawing Sheets

CUSTOMIZABLE CIRCUIT AND METHOD AND MATRIX FOR CREATING A CUSTOMIZED CIRCUIT

The present application claims priority from U.S. Provisional Patent Application 62/995,889 filed Feb. 19, 2020 to J Liberkowski.

FIELD OF THE INVENTION

The invention relates to a customizable circuit and a method for forming a customized circuit. In particular it relates to a method for selectively interconnecting electrical components.

BACKGROUND OF THE INVENTION

In creating new circuits, whether it be integrated circuits (ICs) or printed circuit boards (PC boards) a large amount of time and money is devoted to circuit layout—arranging the electrical components in such a way that they can readily be interconnected with the minimum of layers. Two examples of prior art IC interconnects are shown in FIGS. 1 and 2, illustrating the interconnect layers.

Some PCBs may have twelve or more layers, therefore the ability to reduce the layers needed to achieve component interconnection is of significant value.

In the case of ICs, the cost of the IC is dependent on the number of process steps and thus depends on the number of layers, including the number of metal interconnect layers.

When it comes to creating customized ICs, application specific integrated circuits (ASICs) and field programmable gate arrays (FPGAs) are a commonly used, but the cost is defined not only by the number electrical components that are formed into these devices but also the number of layers and process steps involved.

It would therefore be advantageous to have a standardized interconnect array that makes use of a limited number of conductive layers to define the interconnect lines, especially if the number of layers is limited to only two layers. This applies not only to circuits based on electrical conduction but also photonic circuits.

SUMMARY OF THE INVENTION

According to the invention there is provided an interconnect matrix for creating a customized circuit (e.g., a customized integrated circuit or customized printed circuit board), comprising two layers of spaced-apart, conductive interconnect lines, the first layer including multiple L-shaped conductive lines, each defining a horizontal conductor segment extending in an x-direction, and connected at a vertex to a conductor segment extending in a y-direction, the L-shaped conductive lines defining a substantially rectangular first matrix, and the second layer including multiple conductive line segments arranged in a first direction, also referred to herein as horizontally or in an x-direction, and multiple conductive line segments arranged in a second direction, substantially perpendicular to the first direction, also referred to as vertically or in a y-direction. The horizontally extending line segments and vertically extending line segments may define a substantially rectangular second matrix.

For purposes of this application the terms "conductive" and "conductor" are used to define electrically conductive properties in one embodiment, and light conductive lines in another embodiment.

The first matrix may include electrically conductive lines and the second matrix may include electrically conductive line segments, wherein the two matrices are arranged on top of each other, with either the first matrix or the second matrix being on top, separated by an insulating layer, and configured to be interconnected to establish one or more electrical connections between any one or more conductive line segments in the second matrix and any one or more L-shaped conductive lines in the first matrix.

The interconnections may comprise fused regions and may be fused by any suitable means e.g., using a laser, or, in the case of a Printed Circuit Board (PC board) the interconnections may comprise vias extending through the PC board. In the case of photonic circuits, light channels are created for the interconnections.

Outer ends of the line segments of the second layer may be adapted to connect to electronic component contacts. A contact may include a pad, or in the case of an IC, a pad or highly doped contact region or any other region in an IC that facilitates electrical contact to a component.

The first layer may include additional connection lines in the form of L-shaped conductors arranged parallel to the L-shaped conductive lines. The additional connection lines of the first layer may be arranged between each of the L-shaped conductive lines.

The second layer may include additional connection lines in the form of L-shaped conductors arranged parallel to the horizontally and vertically extending line segments. The additional connection lines of the second layer may be arranged between each of the horizontally and vertically extending line segments.

At least some of the L-shaped electrical conductors, L-shaped conductive lines and line segments in the first and second layers may be made of superconducting material.

Further, according to the invention there is provided a custom electrical circuit comprising first and second layers of spaced-apart, electrically conductive interconnect lines, the first layer including multiple L-shaped conductive lines, each defining a horizontal conductor segment extending in an x-direction, and connected at a vertex to a conductor segment extending in a y-direction, the L-shaped conductive lines defining a substantially rectangular first matrix, and the second layer including multiple conductive line segments arranged in a first direction, also referred to herein as horizontally or in an x-direction, and multiple conductive line segments arranged in a second direction, substantially perpendicular to the first direction, also referred to herein as vertically or in a y-direction, the horizontally extending line segments and vertically extending line segments defining a substantially rectangular second matrix, and further comprising multiple components connected to ends of at least some of the line segments of the second layer, and selectively interconnected by means of conductive paths between selected conductive lines in the first layer and selected line segments in the second layer.

The electrical circuit may be implemented on a printed circuit board (PC board) with the first and second layers defined by the two surfaces of the PC board or may be implemented in an integrated circuit (IC) in which the first and second layers are separated by a non-conductive layer in the IC. The components may include any components typically found in an electrical circuit of that type (either PC board or IC), including, without limitation, transistors, diodes, resistors, capacitors, inductors, etc.

The first layer may include additional connection lines in the form of L-shaped electrical conductors arranged parallel to the L-shaped conductive lines. The additional connection lines of the second layer may be arranged between each of the L-shaped conductive lines.

The second layer may include additional connection lines in the form of L-shaped electrical conductors arranged parallel to the horizontally and vertically extending line segments. The additional connection lines of the first layer may be arranged between each of the horizontally and vertically extending line segments.

Still further, according to the invention, there is provided a method of forming a custom electronic circuit that includes multiple interconnected components, comprising forming an interconnect matrix structure that includes first and second layers of spaced-apart, electrically conductive interconnect lines, the first layer including multiple L-shaped conductive lines, each line defining a horizontal conductor segment extending in an x-direction, and connected at a vertex to a vertical conductor segment extending in a y-direction, the L-shaped conductive lines defining a substantially rectangular first matrix, and the second layer including multiple conductive line segments arranged in a first direction, also referred to herein as horizontally or in an x-direction, and multiple conductive line segments arranged in a second direction, substantially perpendicular to the first direction, also referred to herein as vertically or in a y-direction, the horizontally extending line segments and vertically extending line segments defining a substantially rectangular second matrix, and further comprising connecting multiple components to ends of at least some of the line segments of the second layer, and selectively interconnecting the components by means of conductive paths between one or more of selected L-shaped conductive lines and selected additional connection lines in the first layer and one or more of selected line segments and selected additional connection lines in the second layer.

In the case where the circuit is formed on a PC board, the first and second layers may be defined by the upper and lower surfaces of a dual-sided PC board, it being appreciated that either layer may be on top and the other being on the bottom of the PC board. The forming of conductive paths between selected line segments in the second layer and selected conductive lines in the first layer may, comprise forming vias between the upper and lower surfaces of the PC board.

In the case of an IC, the first and second layers may be defined by conductive layers e.g., metallization layers or highly doped semiconductor layers formed in the IC or on a surface of the IC. The forming of conductive paths between selected line segments in the second layer and selected conductive lines in the first layer may, comprise forming highly doped or metallization regions between the layers. In one embodiment line segments in the first layer are selectively fused to conductive lines in the second layer, e.g., by means of a laser. Other forms of fusing may however be used as known in the art.

In the case of a photonic circuits the conductive L-shaped lines and the conductive line segments are defined by light conducting channels, e.g. light conducting fibers or wave guides. The interconnections may be achieved by light conducting channels such as wave guides.

In one embodiment all of the line segments in the first layer and conductive lines in the second layer are initially interconnected with multiple connections, which are subsequently selectively opened or blown to leave only selected interconnections.

DETAILED DESCRIPTION OF THE INVENTION

Generally, this invention is a device which ultimately provides an assembly of electronic components using a matrix connection area to interconnect those components.

This invention is a device for interconnecting electronic components using a matrix of independent but interconnectable conductive lines or line segments. At least two sets of conductive lines/segments are employed and are situated so that each set is separated from the other by at least one electrically nonconductive or insulating layer and are positioned so that each member of each set may be interconnected through the nonconductive layer to each member of the other set. Each conductive line segment may be uniquely attached to a single connection on an electronic component (e.g., transistor) or, if so desired, may be connected to more than one electronic component. Each electronic component connection may be interconnected to other components via one or more conductive lines, line segments, and connection lines.

Figure 2:
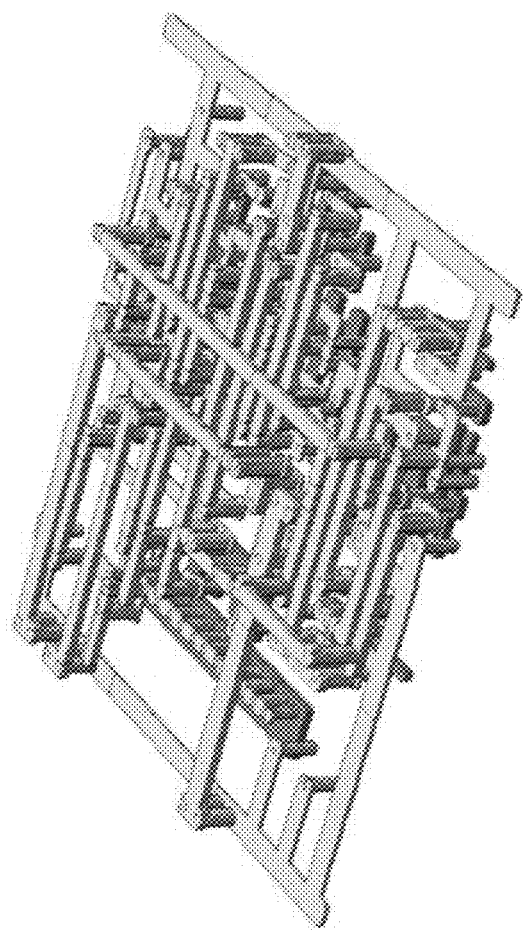
FIG. 2 shows a three-dimensional view of another prior art integrated circuit interconnect structure.
Figure 1:
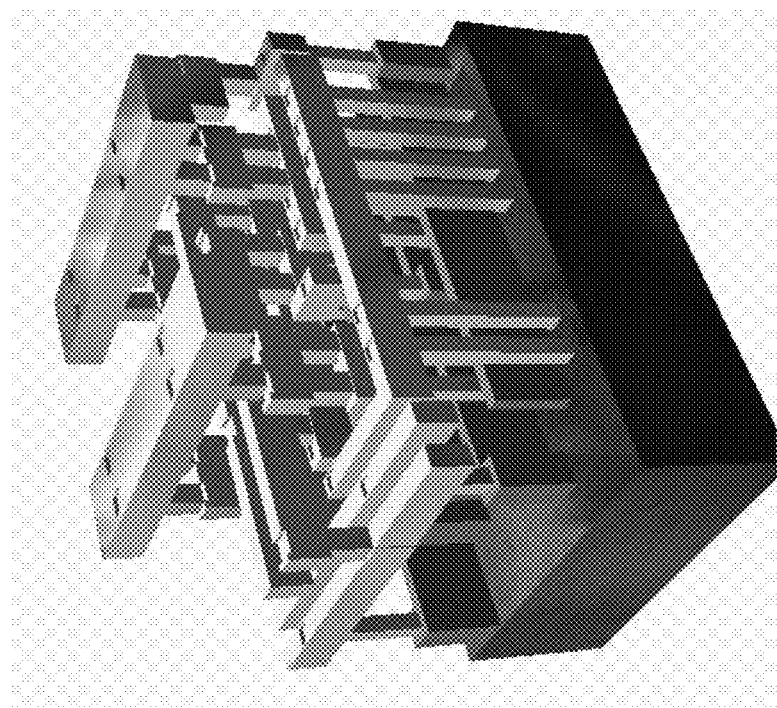
FIG. 1 shows a three-dimensional view of a prior art integrated circuit interconnect structure.
Figure 3:
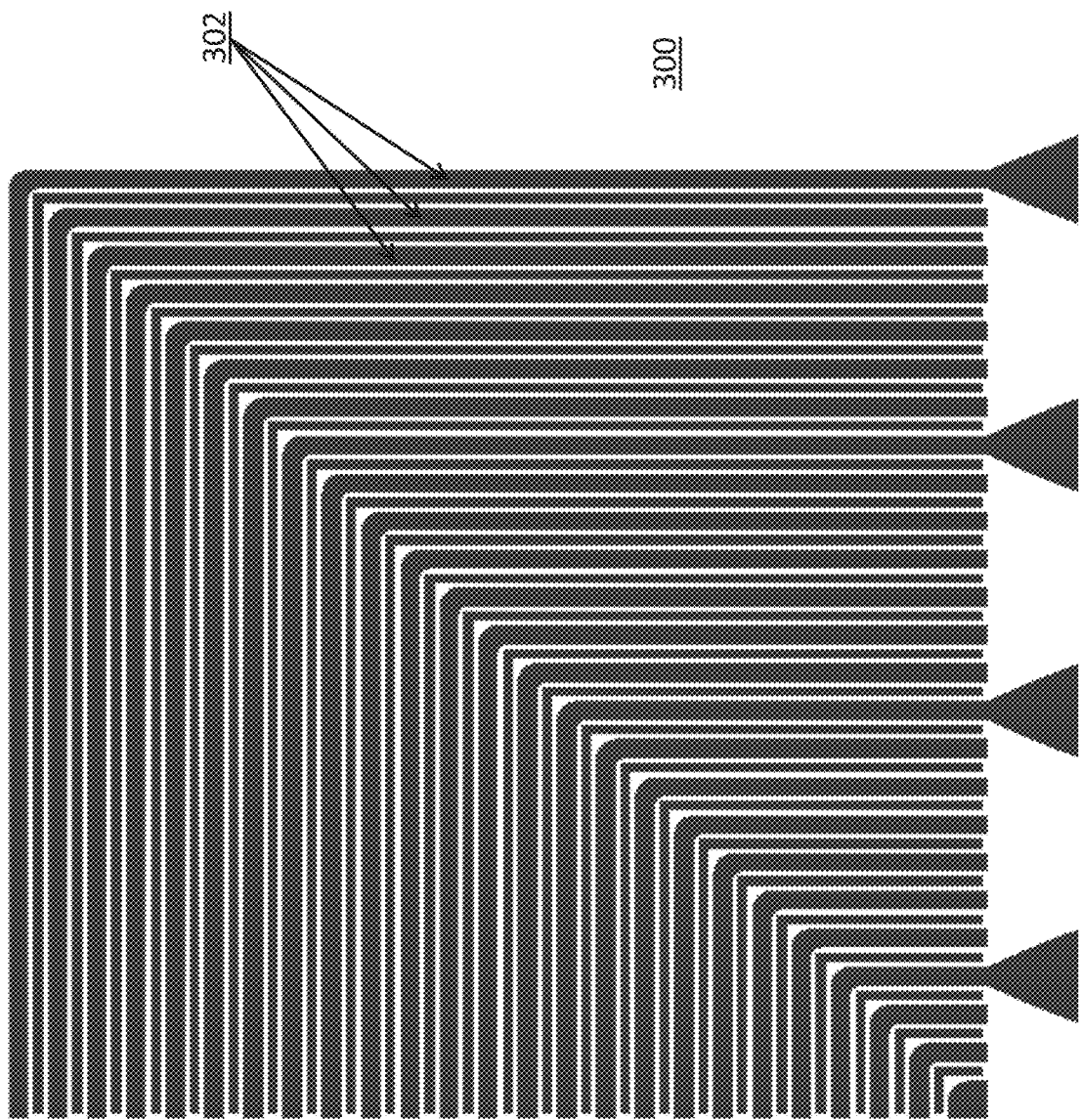
FIG. 3 shows an embodiment of a first layer of a matrix interconnect structure of the present application.

In one embodiment, the invention comprises a matrix of a first set of L-shaped electrically conductive lines 302 in a first layer 300 as shown in FIG. 3. As will be discussed in greater detail below, with respect to FIG. 5, the layer 300 is separated by a substantially non-conducting or insulating layer from a second set of electrically conductive line segments in a second layer.

Figure 4:
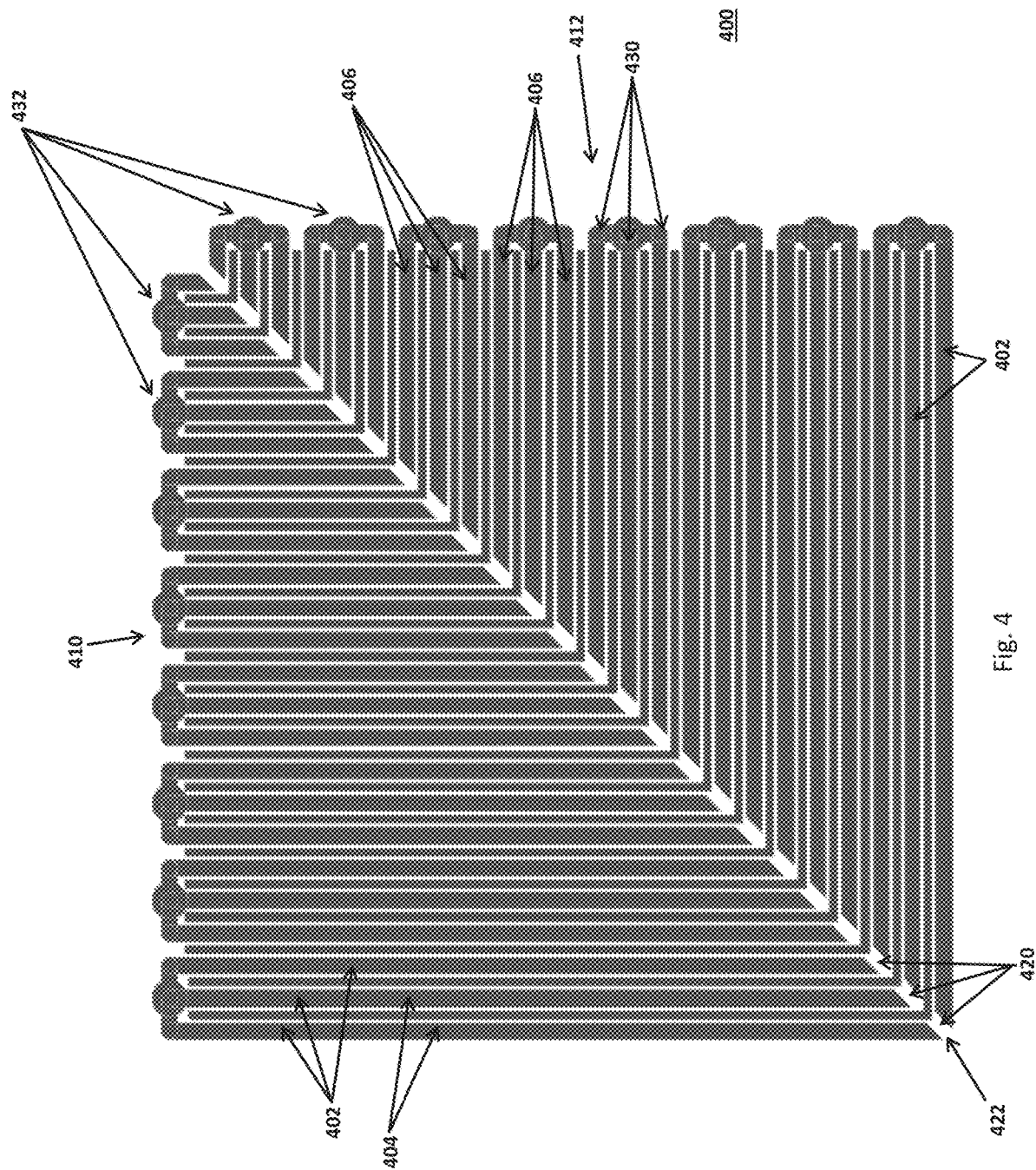
FIG. 4 shows an embodiment of a second layer of a matrix interconnect structure of the present application with a number of electrical components attached.

The second layer 400 is shown in FIG. 4 and includes multiple perpendicularly arranged line segments 402. The line segments 402 comprise vertical line segments 404 extending in a y-direction, and horizontal line segments 406 extending in an x-direction.

Thus, the line segments of the second layer consist of two sets of conductive line segments arranged perpendicularly to each and extending from perpendicular edges 410, 412. Each of the line segments extending in the x-direction, and each of the line segments extending in the y-direction has a different length.

The sets of perpendicularly arranged conductive line segments 404, 406 are not connected. They are separated by small gap 420 so that the gaps of the pairs of perpendicularly arranged line segments lie in a diagonal direction 422 as shown in FIG. 4. Each line segment 404, 406 may be uniquely attached to a single contact 430 on an electronic component 432 (which in this embodiment is generically shown as a transistor for each component in FIG. 4), or, if so desired, may be connected to more than one electronic component, as is discussed in greater detail below. It will be appreciated that the components 432 may each comprise different components (even though in this embodiment they are all depicted by the same reference numeral and are all shown to be three terminal devices) and that they are not limited to transistors. Furthermore, not every line segment 404, 406 need be connected to a component.

Figure 5:
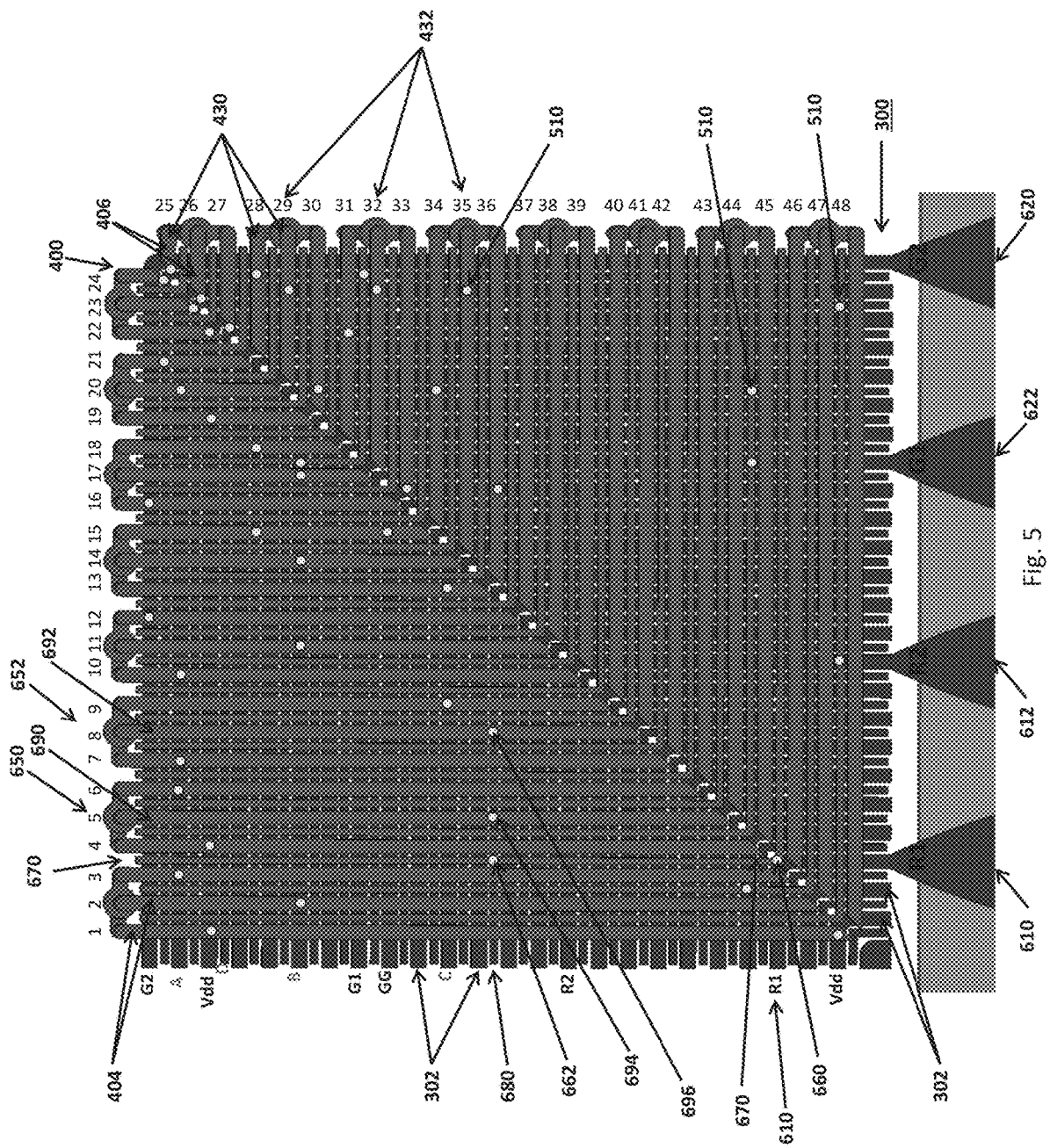
FIG. 5 shows the first layer of FIG. 3 and the second layer of FIG. 4 arranged on top of one another, separated by an insulating layer and with selective conductive paths between the two layers.

Referring to FIG. 5, the first layer 300 and second layers 400 are arranged one on top of the other. Each electronic component connection 430 may be interconnected to another component via a line segment 404 or line segment 406 in the second layer 400, plus an interconnection or conductive path through the insulator (not shown) separating the first layer 300 from the second layer 400, plus an L-shaped conductive line 302 in the first layer 300, plus another interconnection through the insulator, and a line segment 404 or line segment 406 in the second layer 400, said line segment, in turn, connecting to the other component.

This architecture allows connection of all the elements in the device (for example transistors) to each other, as is discussed in greater detail below.

Figure 6:
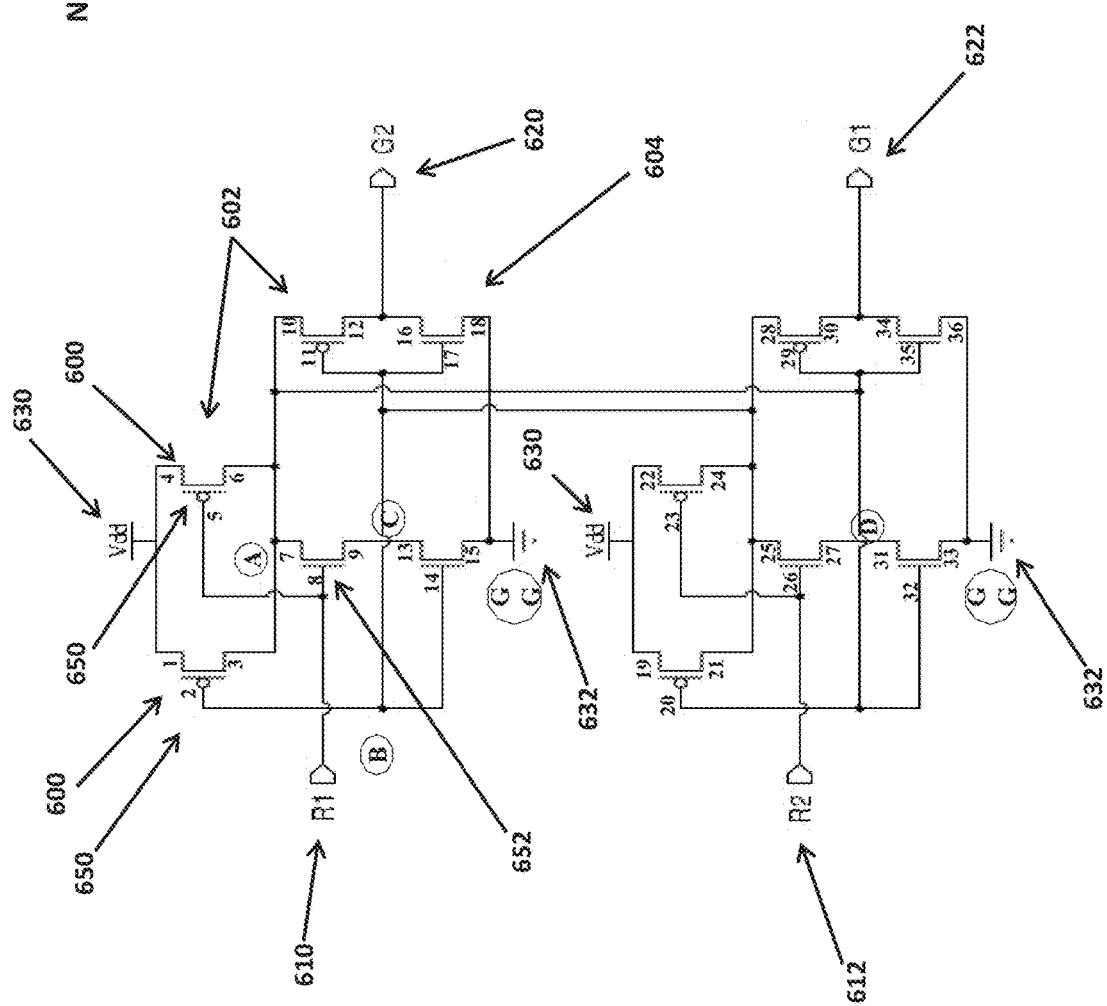
FIG. 6 shows a simple electronic circuit for illustrative purposes.

FIG. 6 shows a simple circuit diagram for illustrative purposes. For purposes of this embodiment, multiple transistors 600, comprising both PMOS transistors 602 and NMOS transistors 604 in this circuit, are interconnected to define a circuit with two inputs 610, 612 depicted as R1 and R2, and two outputs 620, 622 depicted as G2 and G1. Power rails 630 and ground rails 632 (also depicted as GG) are shown providing Vdd and ground to the circuit.

For ease of discussion of the various interconnections, the various gates, sources and drains of the transistors in FIG. 6 are provided with single and double digit numbers. For example, PMOS transistor 650 has its source depicted by numeral 1, its gate depicted by numeral 2 and its drain depicted by numeral 3.

By following the interconnections, it will be appreciated that common interconnections or nodes can be identified. For example, drain 3, drain 7, drain 6, source 10, gate 29, gate 35, gate 32, and gate 20 are all interconnected to define a node, which is depicted as node A.

Similarly, node B is defined by the interconnection of 2, 14, 11, 17, 28, 25, 21, and 24.

Node C is defined by interconnections 9 and 13.
Node D is defined by interconnections 27 and 31.
Similarly input 610 (R1) connects to gate 8 and gate 5.
Input 612 (R2) connects to gate 26 and gate 23.
Output 620 (G2) connects to drain 12 and drain 16.
Output 622 (G1) connects to drain 30 and drain 34.
Power 630 (Vdd) connects to 1, 4, 19, and 22.
Ground 632 (GG) connects to 15, 18, 33, and 36.

Referring back to FIG. 5 it will be noted that interconnections between components can be achieve by conductive paths or interconnects 510 between the first layer 300 and the second layer 400. In the case of a printed circuit board (PC board) the conductive paths may be achieved by means of vias e.g. by etching and plating holes through the board as is known in the art. In the case of an integrated circuit (IC) the first layer and second layer may be defined within the IC or both in the IC and as a layer on the IC. In the embodiment discussed above, in which the components are connected to conductive line segments in the second layer, this second layer may define the lower layer in the IC (even though it is shown in FIG. 5 as being on top). The conductive paths or interconnects in the case of an IC may be achieved in any known method in the art, e.g. by selectively fusing together line segments in the second layer with L-shaped conductive lines in the first layer. This may be done, for example by means of a laser.

In order to connect, for example, input 610 (R1) to the gate 5 of PMOS 650 and the gate 8 of NMOS 652, the input R1 (see FIG. 5), which is defined by L-shaped conductive line 610, is connected to the second layer by means of conductive path 660 that joins L-shaped conductive line 610 to additional connection line 670 formed in the second layer. The additional connection line 670, in turn connects to additional connection line 680 (formed in the first layer) by means of conductive path 662. Additional connection line 680 then connects to line segment 690 and line segment 692, by means of conductive paths 694, 696. The line segments 690, 692 connect to gate 5 and gate 8, respectively, thereby connecting input R1 to gates 5 of PMOS 650 and gate 8 or NMOS 652.

It will be noted in the present embodiment shown in FIGS. 3 to 5 that both the first layer and the second layer are provided with the additional L-shaped connection lines between the L-shaped conductive lines of the first layer, and the line segments of the second layer. However, in other embodiments the interconnect matrices defined by the various conductors of the first and second layers may include different numbers and locations for the additional connection lines.

Figure 7:
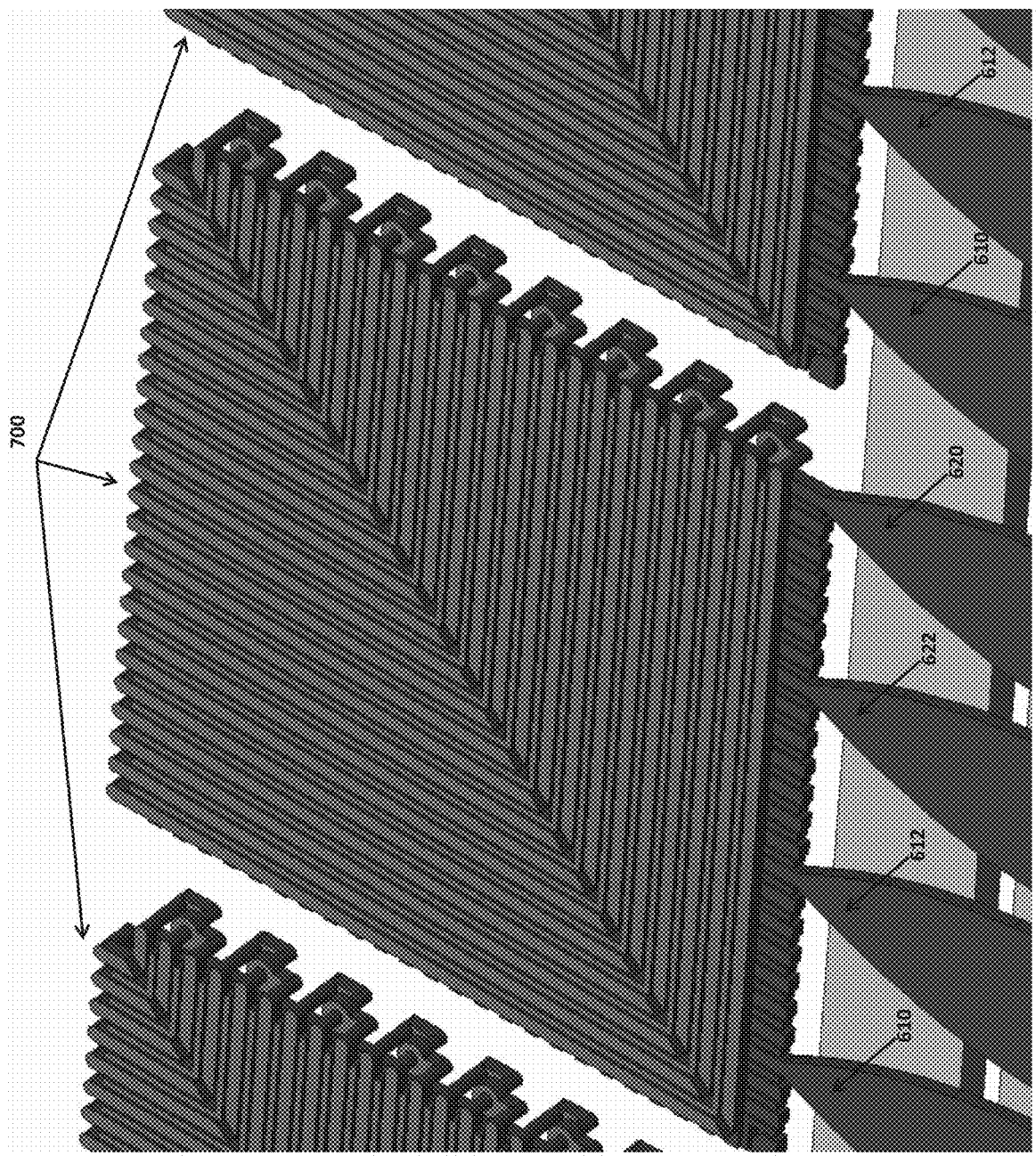
FIGS. 7 and 8 show second level matrix structures of one embodiment of the invention.
Figure 8:
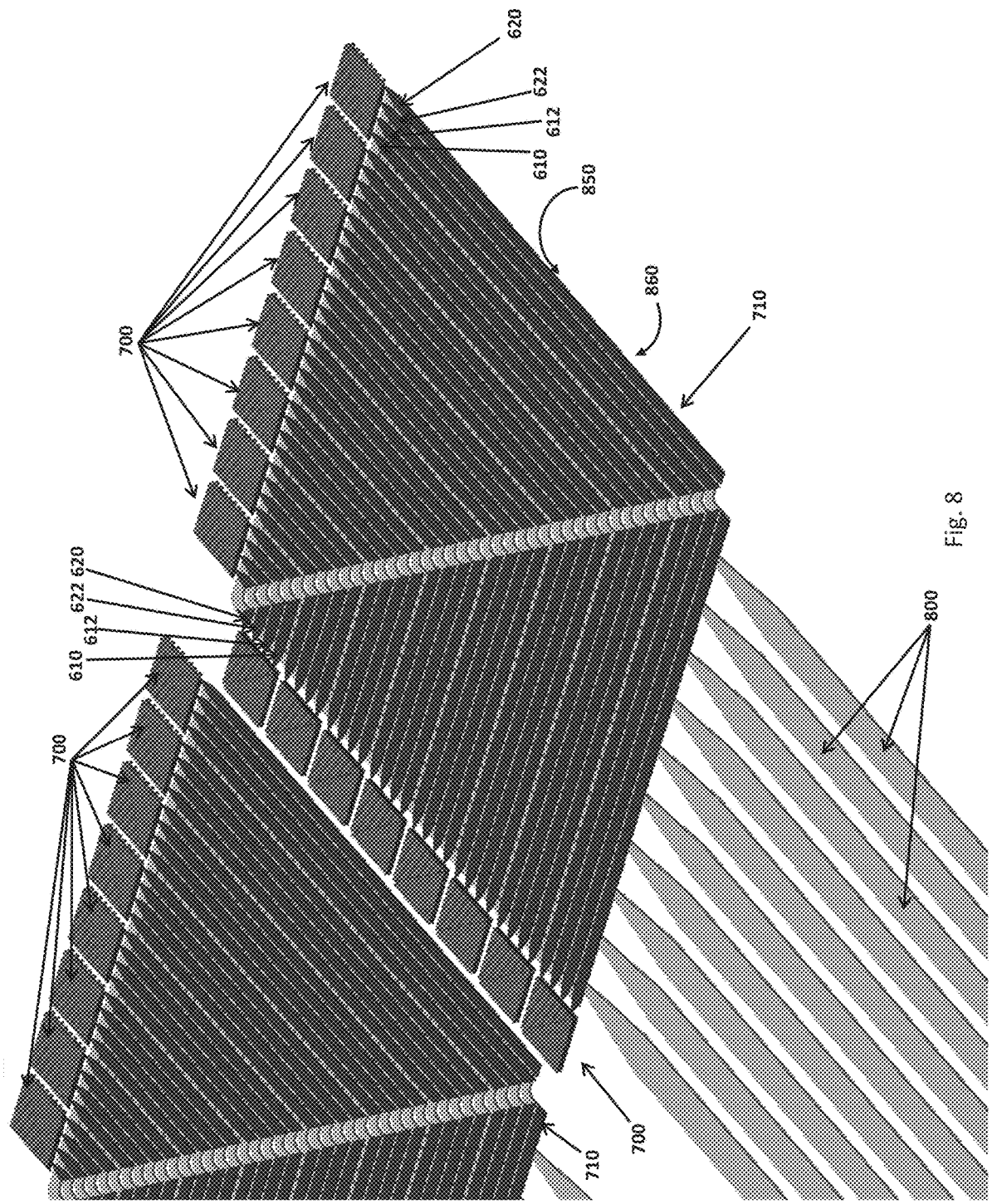

It will be appreciated that the circuit depicted in the embodiment of FIG. 5 only accommodates sixteen transistors. In other words, 48 contacts. In order to support larger circuits, with more components, several levels of matrices may be created. If the matrix structure of FIG. 5 is considered the standard cell or the first level, a second level may be defined by interconnecting multiple standard cells 700 as shown in FIGS. 7 and 8. The inputs 610, 612 (R1 and R2) and the outputs 620, 622 (G2 and G1) are led out of one edge of each of the standard cells 700 and interconnected by a second level matrix structure 710, which again comprises only two layers of L-shaped conductive lines and conductive line segments. For ease of reference the same reference numerals 610, 612, 622, 620 were used for the I/Os of each of the standard cells, however it will be appreciated that the standard cells could all be different, each with a different circuit and different inputs and outputs.

As shown in FIG. 8, the I/Os from the standard cells are connected to conductive line segments of the second level, second matrix 850, which in this embodiment is positioned above and spaced from L-shaped conductive lines of a second level, first matrix 860.

It will also be noted that in this embodiment for the second level there are ten Input/Outputs (I/Os) 800.

Figure 9:
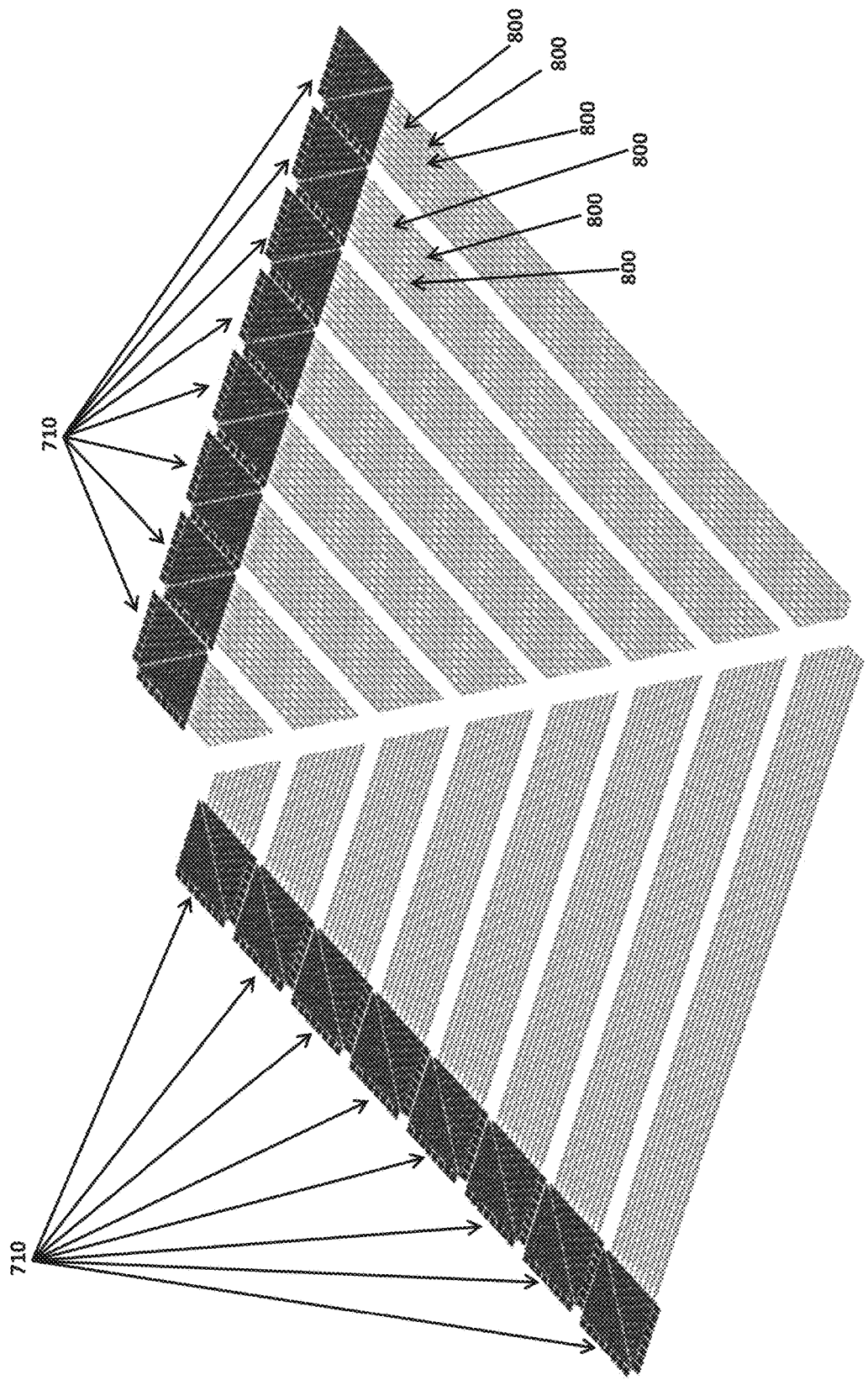
FIG. 9 shows a third level matrix structure of one embodiment of the invention.

Similarly, further levels of matrices can be defined such as the third level (two layer matrix structure) shown in FIG. 9, which again takes the I/Os from the previous level (in this case I/Os 800) and configures them into a matrix structure with the I/Os connected to conductive line segments to define a second layer at the third level, which is separated (by means of an insulating layer) from a first layer of level 3, thereby defining a matrix of conductive line segments.

It will be appreciated that the size of the standard cell can be different to that of the embodiment of FIG. 5. There could, for instance be a different number of vertical conductors or a different number of horizontal conductors. So, the size of the circuit (number of components) can be increased by either increasing the size of the standard cell or by adding additional levels.

This invention will create a new design flow and enhanced hierarchy that will reduce custom IC design cycle time dramatically, enabling more efficient custom IC design and PC board design, and fabrication, and enable the production of high performance electronic solutions faster and with more flexibility.

This invention sharply reduces the barriers to use of custom integrated circuits built using leading-edge CMOS technology while maintaining the high level of performance at power promised by this technology.

This invention thus provides rapid fully customizable IC programming capability.

It will be appreciated however, that while the above embodiment was directed specifically to a custom IC, the invention applies also to other circuit implementations, for example, those implemented on a PC board or using photonics. Specifically the interconnect matrix and electrical circuits using the matrix concepts of the present invention, can be implemented using superconducting material where some or all of the L-shaped electrical conductors, L-shaped conductive lines and line segments are made of superconducting material.

What is claimed is:

1. An interconnect matrix for creating a customized circuit, comprising:
    two layers of spaced-apart, conductive interconnect lines, the first layer including a first set of multiple L-shaped conductive lines, each defining a horizontal conductor segment extending in an x-direction, and connected at a vertex to a conductor segment extending in a y-direction, the L-shaped conductive lines defining a substantially rectangular first matrix, and the second layer including multiple conductive line segments arranged in a first direction, also referred to herein as horizontally or in an x-direction, and multiple conductive line segments arranged in a second direction, substantially perpendicular to the first direction, also referred to as vertically or in a y-direction, wherein the horizontally extending line segments and vertically extending line segments of the second layer define a substantially rectangular second matrix, and wherein the first matrix includes a second set of L-shaped conductive lines interspersed between the L-shaped conductive lines of the first set, and the second matrix includes L-shaped conductive lines interspersed between the conductive line segments of the second matrix.

2. An interconnect matrix of claim 1, wherein the first matrix includes electrically conductive lines and the second matrix includes electrically conductive line segments, wherein the two matrices are arranged on top of each other, with either the first matrix or the second matrix being on top, separated by an insulating layer, and configured to be interconnected to establish one or more electrical connections between any one or more conductive line segments in the second matrix and any one or more L-shaped conductive lines in the first matrix.

3. An interconnect matrix of claim 2, wherein the electrical connections comprise fused regions or vias.

4. An interconnect matrix of claim 3, wherein outer ends of the line segments of the second layer are adapted to connect to electronic component contacts.

5. An interconnect matrix of claim 4, wherein electronic component contacts include a pad or highly doped contact region.

6. An interconnect matrix of claim 3, wherein the first layer includes additional connection lines in the form of L-shaped conductors arranged parallel to the L-shaped conductive lines, and wherein the second layer includes additional connection lines in the form of L-shaped conductors arranged parallel to the horizontally and vertically extending line segments.

7. An interconnect matrix of claim 6, wherein at least some of the L-shaped electrical conductors, L-shaped conductive lines and line segments are made of superconducting material.

8. An interconnect matrix of claim 6, wherein the electrical connections can extend vertically between the layers, or horizontally between L-shaped conductors and additional L-shaped conductors of the first layer, or horizontally between line segments and additional L-shaped conductors of the second layer.

9. A custom electrical circuit comprising:
    first and second layers of spaced-apart, electrically conductive interconnect lines, the first layer including multiple L-shaped conductive lines, each defining a horizontal conductor segment extending in an x-direction, and connected at a vertex to a conductor segment extending in a y-direction, the L-shaped conductive lines defining a substantially rectangular first matrix, and the second layer including multiple conductive line segments arranged in a first direction, also referred to herein as horizontally or in an x-direction, and multiple conductive line segments arranged in a second direction, substantially perpendicular to the first direction, also referred to herein as vertically or in a y-direction, the horizontally extending line segments and vertically extending line segments defining a substantially rectangular second matrix, and further comprising:
    multiple components connected to ends of at least some of the line segments of the second layer, and selectively interconnected by means of conductive paths between selected conductive lines in the first layer and selected line segments in the second layer.

10. A custom electrical circuit of claim 9, wherein the electrical circuit is implemented on a printed circuit board (PC board) with the first and second layers defined by two surfaces of the PC board or is implemented in an integrated circuit (IC) in which the first and second layers are separated by a non-conductive layer in the IC.

11. A custom electrical circuit of claim 10, wherein the components include any components typically found in an electrical circuit of that type, including one or more of transistors, diodes, resistors, capacitors, and inductors.

12. A custom electrical circuit of claim 11, wherein the first layer includes additional connection lines in the form of L-shaped electrical conductors arranged parallel to the L-shaped conductive lines, and the second layer includes additional connection lines in the form of L-shaped electrical conductors arranged parallel to the horizontally and vertically extending line segments.

13. A method of forming a custom electronic or photonic circuit that includes multiple interconnected components, comprising:
    forming an interconnect matrix structure that includes first and second layers of spaced-apart, conductive interconnect lines, the first layer including multiple L-shaped conductive lines, each line defining a horizontal conductor segment extending in an x-direction, and connected at a vertex to a vertical conductor segment extending in a y-direction, the L-shaped conductive lines defining a substantially rectangular first matrix, and the second layer including multiple conductive line segments arranged in a first direction, also referred to herein as horizontal or x-direction, and multiple conductive line segments arranged in a second direction, substantially perpendicular to the first direction, also referred to herein as vertical or y-direction, the horizontally extending line segments and vertically extending line segments defining a substantially rectangular second matrix, and further comprising:

connecting multiple components to ends of at least some of the line segments of the second layer, and selectively interconnecting the components by means of conductive paths between one or more of selected L-shaped conductive lines in the first layer and one or more selected line segments in the second layer.

14. A method of claim 13, further comprising forming additional connection lines in the form of L-shaped conductors arranged parallel to the L-shaped conductive lines of the first matrix, and forming additional connection lines in the form of L-shaped conductors arranged parallel to the horizontally and vertically extending line segments in the second matrix.

15. A method of claim 14, wherein the forming of conductive paths between selected line segments or additional connection lines in the second layer and selected conductive lines or additional connection lines in the first layer, comprises forming highly doped or metallization regions between the layers, or selectively fusing conductive lines, additional connection lines, and line segments.

16. A method of claim 13, wherein the circuit is formed on a PC board, and the first and second layers are defined by the upper and lower surfaces of a dual-sided PC board, and wherein the forming of conductive paths between selected line segments in the second layer and selected conductive lines in the first layer comprises forming vias between the upper and lower surfaces of the PC board.

17. A method of claim 13, wherein the circuit is defined in an IC, the first and second layers being defined by metallization layers or highly doped semiconductor layers formed in the IC or on a surface of the IC.

18. A method of claim 13, wherein the circuit is a photonic circuit, and the conductive L-shaped lines and the conductive line segments are defined by light conducting channels, and the interconnections are achieved by light conducting channels.

19. A method of claim 13, wherein all of the line segments in the first layer and conductive lines in the second layer are initially interconnected with multiple connections, which are subsequently selectively opened or blown to leave only selected interconnections.

* * * * *